US010395743B2

(12) United States Patent
Zheng

(10) Patent No.: US 10,395,743 B2
(45) Date of Patent: Aug. 27, 2019

(54) METHOD AND SYSTEM FOR IMPLEMENTING ONE-WIRE PROGRAMMABLE CIRCUIT

(71) Applicant: INTELLISENSE (XIAMEN) MICROELECTRONICS LTD., Xiamen (CN)

(72) Inventor: Zheng Zheng, Xiamen (CN)

(73) Assignee: INTELLISENSE (XIAMEN) MICROELECTRONICS LTD., Xiamen (CN)

( * ) Notice: Subject to any disclaimer, the term of this patent is extended or adjusted under 35 U.S.C. 154(b) by 0 days.

(21) Appl. No.: 15/675,668

(22) Filed: Aug. 11, 2017

(65) Prior Publication Data

US 2017/0345513 A1    Nov. 30, 2017

Related U.S. Application Data

(63) Continuation of application No. PCT/CN2016/074387, filed on Feb. 24, 2016.

(30) Foreign Application Priority Data

Feb. 28, 2015    (CN) .......................... 2015 1 0091110

(51) Int. Cl.
*G06F 13/14* (2006.01)
*G11C 17/14* (2006.01)
(Continued)

(52) U.S. Cl.
CPC ............ *G11C 17/143* (2013.01); *G06F 13/14* (2013.01); *G06F 13/38* (2013.01); *G11C 17/18* (2013.01)

(58) Field of Classification Search
CPC ............................. G11C 17/143; G06F 13/14
(Continued)

(56) References Cited

U.S. PATENT DOCUMENTS 9,019,791 B2 * 4/2015 Chung ................. G11C 29/028
365/148
2001/0021956 A1 * 9/2001 Okamoto .............. G06F 13/385
710/301

(Continued)

FOREIGN PATENT DOCUMENTS

CN    102929820 A    2/2013
CN    103209379 A    7/2013

*Primary Examiner* — Hoai V Ho
*Assistant Examiner* — Muna A Techane
(74) *Attorney, Agent, or Firm* — Wayne & Ken, LLC; Tony Hom

(57) ABSTRACT

The present disclosure relates to method and system of implementing one wire programmable circuit by using the same terminal OUT as both main circuit output terminal and the digital I/O interfacing terminal of the circuit. The present invention overcomes the shortcoming of prior arts and does not require the circuit to be powered down first and then powered up again each time the circuit is switched between interfacing mode (read/write/program OTP) and the normal output mode, therefore shorten the time of interfacing with the OTP as well as simplified the interfacing system used to read/write/program the OTP. The present invention also enables the possibility to put the no longer required system clock into sleeping mode after the OTP has been programmed, and has the advantages of reducing system power consumption as well as system noise due to the existing of digital clock.

5 Claims, 4 Drawing Sheets

(51) Int. Cl.
  *G06F 13/38* (2006.01)
  *G11C 17/18* (2006.01)
(58) Field of Classification Search
  USPC .......................................................... 365/96
  See application file for complete search history.

(56) References Cited

U.S. PATENT DOCUMENTS

| | | | |
|---|---|---|---|
| 2011/0145777 A1* | 6/2011 | Iyer .................... | G06F 12/0844 716/132 |
| 2012/0147657 A1* | 6/2012 | Sekar ...................... | G11C 7/00 365/148 |
| 2013/0195288 A1* | 8/2013 | Ye ............................ | H04R 1/08 381/111 |
| 2014/0211567 A1* | 7/2014 | Chung .................... | G11C 17/16 365/185.18 |
| 2015/0009743 A1 | 1/2015 | Chung | |

* cited by examiner

METHOD AND SYSTEM FOR IMPLEMENTING ONE-WIRE PROGRAMMABLE CIRCUIT

TECHNICAL FIELD

The present invention relates to method and system to use the same circuit terminal as both the circuit output terminal and the digital I/O terminal of the circuit, thus realizing one wire programmable circuit.

BACKGROUND OF INVENTION

There is a more and more widely use of Memory, such as OTP, in integrated circuit to control various circuit parameters. Circuits used one wire programmable interface can be found in programmable amplifier, programmable clock, programmable potentiometer, programmable capacitor, programmable SOC, programmable integrated sensor as well as ASIC used in the sensor calibration and temperature compensation.

SPI (4 wire) and I2C (2 wire) protocol has the advantages of fast communication as well as high reliability, they are widely used in communicating with the internal memory from the outside circuit, but they required extra circuit terminals (4 wires and 3 wires)

One wire programmable or single wire programmable protocol only adopts one terminal (one wire) by using the same circuit terminal as both the circuit output terminal and the digital I/O terminal the circuit uses to interface with external circuit. The protocol therefore doesn't need extra pin to digital interface with external circuit. Using the protocol, one wire programmable circuit can be pin to pin compatible with their non-programmable counterparts, and programmable circuit that requires only three pins, VDD, GND and Output can be realized. The one wire programming protocol is widely used in circuit designed for sensor calibration, programmable amplifier, programmable clock, programmable potentiometer, programmable capacitor, programmable SOC etc.

The one wire programming protocols in prior arts were realized by monitoring the status of one wire terminal (OUT) when the circuit is powered up. If during powered up, in at predetermined time slot, the one wire terminal (OUT) receives predetermined signals, then, the circuit goes into interfacing mode, of which external interface circuit can Read (i.e download data from one wire programmable circuit, or Write, i.e. upload data to the one wire programmable circuit or Program, i.e. fusing the OTP by passing high current through the OTP in the one wire programmable circuit). If during the predetermined time slot, no predetermined signals are received, the circuit goes into its normal output mode. The circuit will not change its operation mode until it is shutdown and powered up again to decide which state to go into. Since switching between the interfacing mode and the normal output mode would require the circuit to be shutdown and then powered up, the process prolongs the time needed to find the right OTP code as well as programming the OTP due to the fact that many times of switching between the interfacing mode and the normal output mode are required in the process to find the right OTP code. The requirement of switching between the interfacing mode and the normal output mode also makes the test system complicated.

SUMMARY OF PRESENT INVENTION

In view of the disadvantages of the prior arts, the objectives of the present invention are to provide method and system to implement one-wire programmable circuit that overcomes the shortcomings as discussed above.

The present invention provides a method and system of implementing one-wire programmable circuit. The one wire programmable circuit provided in current embodiment includes main circuit module, memory (OPT) that controls the main circuit module, OTP controlling module that controls the read/write/program of OTP, the one wire to multi-wire converter that communicates with the OTP, the first analog switch S1, the second analog switch S2, and the third analog switch S3 that are controlled by a bit OTPL in the OTP module, the resistor R1 that is connected in parallel with the first analog Switch S1, the system clock (OSC) that is controlled by the third analog Switch S3. One terminal of R1 and the first analog switch S1's parallel connection is connected to the main circuit module's terminal Vout, the other terminal of the R1 and the first analog switch S1's parallel connection is connected to circuit output terminal OUT; The one terminal of one wire to multi-wire converter can be connected to the terminal OUT through the second analog Switch S2 or directly to the OUT terminal. The other terminal of one wire to multi-wire converter is connected to OTP controlling module. OTP controlling module is connected to OTP module and through OTP module, controlling the various parameters of the main circuit.

In another preferred solution of present invention, the bit OTPL used for controlling the switch of the first analog switch S1, the second analog switch S2, and the third analog switch S3 is different from the other bits in the OTP. The OTPL output state is not affected by the read/write of OTP. The output state of OTPL bit is changed only after the OTPL bit is programmed, the output state of OTPL bit is used to control the analog switch S1, S2, S3 and the status of OTP control module.

In yet another preferred solution of the present invention, when the bit OTPL is programmed, the bit OTPL changes the first analog switch S1 from open to close, and make the main circuit output connected to terminal OUT through S1.

In yet another preferred solution of the present invention, the OTP control module controls various programmable parameters of the circuit before the OTPL is programmed. After the OTPL is programmed, those parameters are then controlled by the OTP module. The programming (fusing) of OTP uses the OTP control module and the programming is done bit by bit.

In yet another preferred solution of the present invention, after the bit OTPL has been programmed, the status of OTPL can be used to change the second analog switch S2 from close to open, thus, the terminal OUT will be disconnected from the circuit modules used for interfacing to the OTP and only connected to the main circuit module.

In yet another preferred solution of the present invention, if after the OTP is programmed, there is no need for the existence of the system clock, the output state of OTPL can be used to change the state of the third analog switch S3 and put the system clock into sleeping mode.

In yet another preferred solution of the present invention, there is a time delay between the moment bit OTPL is programmed and the time it outputs its control signal to control the analog Switch S1, S2, S3 and OTP control module.

In yet another preferred solution of the present invention, the external circuit used to interface with the one wire programmable circuit includes: bi-directional I/O terminal with pull up resistor which is connected to OUT terminal through the fourth analog switch S4; When the external system need to read/write/program the OTP data, the switch S4 is closed, the fifth analog switch S5 is open. If the external interface circuit needs to read the output of the main circuit, the fourth analog switch S4 is open, the fifth analog switch S5 is closed.

The present invention also provides a procedure to read/write/program the one-wire circuit.

Step No. 1: Connected the one wire programmable circuit with the external programming interface, power both system up.

Step No. 2: Open the fourth analog Switch S4, close the fifth switch S5, use measurement equipment or measurement circuit to measure the output of main circuit module through OUT terminal. If the output at terminal OUT meets the specification, go to step No. 5; if the output of terminal OUT does not meet the specification, continue to Step No. 3.

Step No. 3: Close the fourth analog switch S4, open the fifth analog S5, external programming interface read/write OTP through terminal OUT Step No. 4: According to the measurement results and the current data in OTP, the OTP data was set. Repeat step No. 2, No. 3 and No. 4, until the data in the OTP which control various parameters in the one wire programmable circuit makes the circuit to meet its the specification, then continue to step No. 5.

Step No. 5: Close the fourth analog S4, open the fifth analog switch S5, the external programmable interface executes the programming(fusing) of OTP, including the last bit of OTP, OTPL.

Step No. 6: Open the fourth analog switch S4, close the fifth analog S5, measurement the signal terminal OUT, verify that all the specifications are met after the OTP has been programmed. If the specifications are met, the circuit is OK and put into inventory. Otherwise, the circuit is rejected.

To summarize, by using the same circuit terminal (OUT) as both the main circuit output terminal and digital I/O terminal, the system in present invention is one-wire programmable. The method and system in present invention overcomes the shortcoming of one wire programmable circuit in prior arts and doesn't require the circuit to be shutdown and powered up again each time when changed from interfacing mode to normal output mode, thus improving the interfacing efficiency as well as simplifying the test system. In the meantime, after the OTP is programmed, the present invention can set the system clock into sleep mode, therefore, reducing the system power consumption as well as the noise in the system.

Figure 1:
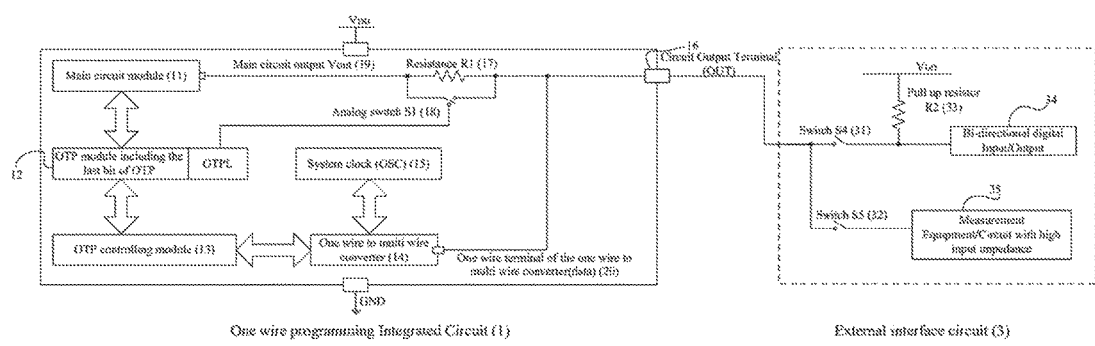
FIG. 1 is the block circuit diagram of one wire programmable circuit described in present invention

DESCRIPTION OF THE COMPONENTS IN THE DRAWINGS 1. one wire programming Integrated Circuit;
3: External Interface Circuit
11. Main circuit module;
12. OTP module including the last bit of OTP: OTPL
13. OTP controlling module;
14. One wire to multi wire converter
15. System Clock (OSC);
16: Circuit Output Terminal (OUT)
17: Resistance R1;
18. The first analog switch S1;
19: Main Circuit Output Vout;
20. One wire terminal of the one wire to multi wire converter(data)
21. The second analog switch with inverter S2;
22. The third analog switch S3;
31. The fourth analog switch S4;
32. The fifth analog switch S5;
33. Pull up resistor R2;
34. Bi-directional digital Input/Output (I/O);
35. Measurement Equipment/Circuit with high input impedance.

DETAILED DESCRIPTION OF THE PRESENT INVENTION

Please refer to the accompanying drawings. It should be noted that the drawings provided in the embodiments only schematically describe the basic ideas of the present invention, so the drawings only show the components related to the present invention, but are not plotted according to the number, shape and size of the components in actual implementation. The configuration, number, and proportion of the components in actual implementation may be changed at will and the layout of the components may be more complex.

The detailed implementation manners of the present invention are further described in detail below with reference to accompanying drawings.

FIG. 1 is the block diagram of one wire programmable circuit described in current invention, it includes the one wire programmable Integrated Circuit (1) and external Programming Interface (3).

The one wire programmable circuit includes main circuit module (11), One time programmable (OTP) memory (12) that control the main circuit module, OTP controlling module (13) that control the read/write/programming of the OTP; One wire to multi-wire converter (14) that communicate data between terminal OUT and OPT controlling module (13); The first analog switch S1 which is controlled by the bit OTPL in OTP, Resistor R1 (17) that is connected parallel with the first analog switch S1 (18), System Clock (OSC) (15); One terminal of the R1/S1 parallel connection is connected to Main Circuit Module terminal Vout (19), the other terminal of the R1/S1 parallel connection is connected to OUT terminal (16); the one wire terminal data (20) of the one wire to multi-wire converter (14) is connected to OUT terminal (16), the other terminal of the one wire to multi-wire converter is connected to the OTP controlling module (13); OTP controlling module (14) is connected with OTP module (12) and through the OTP control various parameters in the circuit.

The external interface circuit 3 includes: bi-directional I/O port (34) with pull up resistor R2, the I/O port (34) is connected through the fourth analog Switch S4 (31), to OUT terminal of the one wire programmable circuit 1. Measurement Instrument/Measurement Circuit (35) with high input impedance is connected to OUT terminal (16) of one wire programmable circuit 1 through the fifth analog switch S5 (32).

As illustrated in FIG. 1, connected the one wire programmable circuit with the external interfacing circuit, power up both systems. For read/write the data from/to the OTP, the fourth analog switch S4 (31) is close, the fifth analog switch S5 (32) is open, the external programming I/O port (34) executes the program to read/write OTP data. Since OTPL is still not programmed, the first analog switch S1 (18) is open, OUT terminal (16) is connected through R1 (17) to main circuit Vout Terminal (19). Since R2<<R1, therefore, the voltage at the terminal data (20) will not be influenced by Vout's voltage, but follow the change of the voltage at the bi-directional I/O port (34). The one wire to multi-wire converter (14) and the OTP controlling module (13) complete the read/write of data from the external interfacing circuit to the OTP.

When measurement of the voltage output at the main circuit module is needed, the fourth analog switch S4 (31) is open and fifth analog switch S5 (32) is closed, the measurement instrument/Measurement Circuit (35) measure the voltage output at OUT terminal (16). Since R1<<Input impedance of the measurement Instrument/Circuit (35), the voltage of terminal OUT (16) is equal to the voltage at terminal Vout (19).

Figure 2:
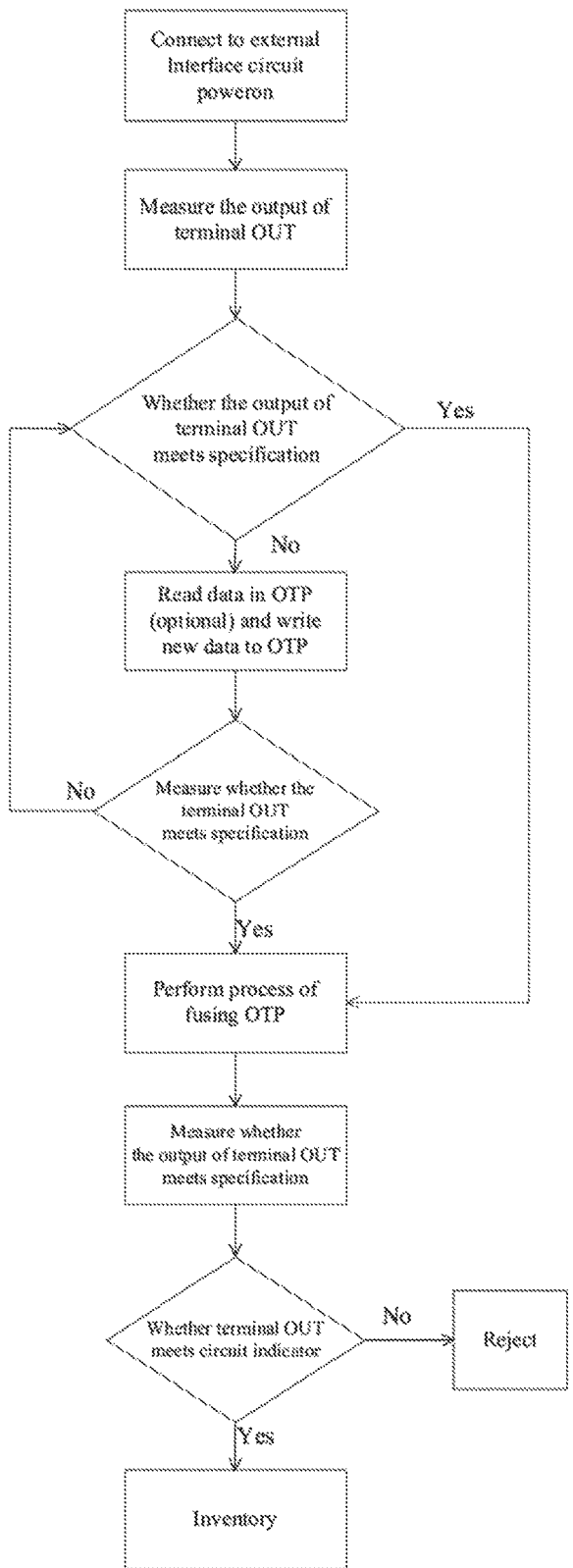
FIG. 2 is the flow chart of using the one wire programmable circuit described in present invention

FIG. 2 illustrates the flow chart of steps to find the right OTP code and program the OTP to make the circuit met the specification. A set of test and measurement procedure is carried out and the setting of OTP is calculated according to the specification needed by the circuit. After the right codes are found, close the fourth analog switch S4 (31) and Open the fifth analog switch S5 (32), the external interfacing circuit execute the program to program the OTP through one wire to multi-wire module (14) and OTP controlling module (13), and the calculated OTP setting is programmed into the OTP.

After the OTP has been programmed, the last bit of the OTP, i.e. OTPL's output state is changed (from 0 to 1 or from 1 to 0) after certain delay time. The change of OTPL's state changes the first analog switch S1 (18) from Open to Close, R1 (17) is short-circuit by the first analog switch S1 (18), Vout terminal (19) is connected to OUT terminal (17) by S1. Since S1 (18) has low resistance, therefore, voltage at OUT terminal (16) equal to voltage of Vout terminal (19) at the main circuit module.

Measure the output at the OUT terminal and verify that all the specifications are met after the OTP has been programmed.

After finishing the above procedure, the calculated setting of OTP is programmed into the OTP. The output of OTPL bit set the circuit to operate in normal output mode, the parameters of the circuit is controlled by the programmed OTP. The system in the present invention realize using the same terminal OUT (16) as both the output of main circuit module and the interfacing port of the OTP, thus realizing the one wire programming system.

Figure 3:
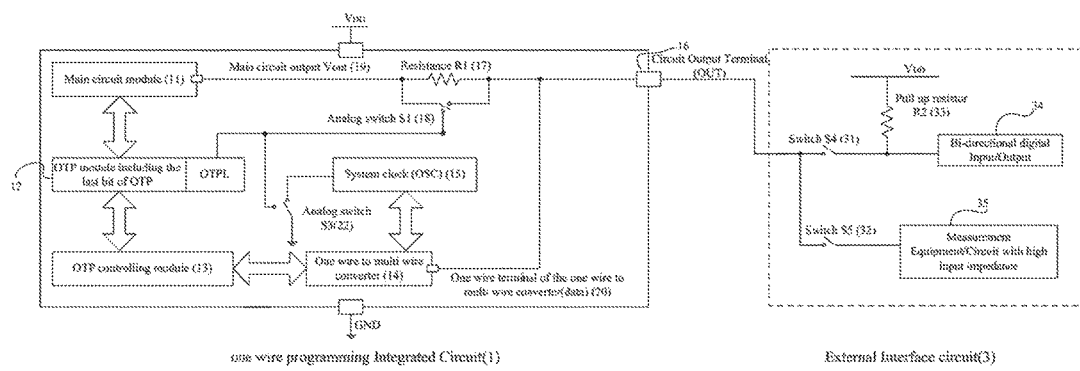
FIG. 3 is the block circuit diagram of the one wire programmable circuit described in the present invention whereas the system clock is powered down by the close of the third analog switch S3 after the bit OTPL is programmed.

FIG. 3 shows another preferred solution of present invention, for systems that do not require a system clock, such as programmable amplifier, programmable potentiometer/Capacitor, the out state of the OTPL after it is programmed can be used to change the status of the third analog switch S3 (22) and put the system clock into sleeping mode, thus reduce the system power consumption as well as system noise due to the digital clock.

Figure 4:
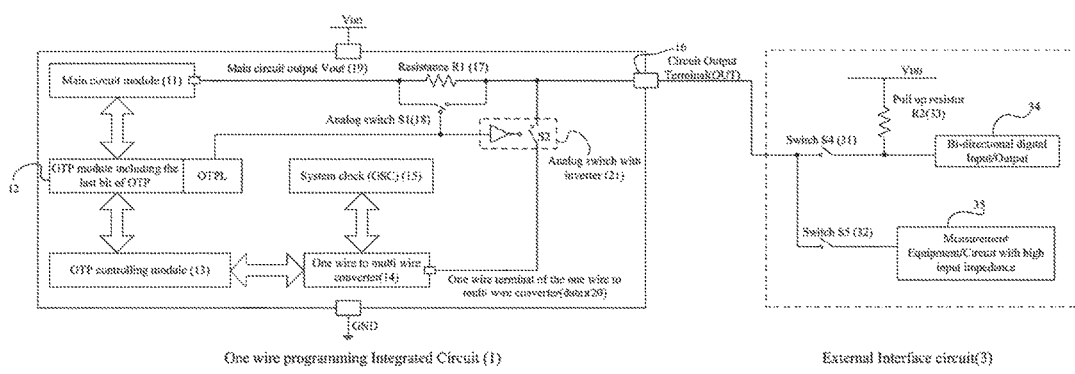
FIG. 4 is the block circuit diagram of the one wire programmable circuit described in the present invention whereas the programmable port is disconnected from the terminal OUT by the close of the second analog switch S2 after the bit OTPL is programmed.

FIG. 4, shows yet another preferred solution of the present invention, the output state of the programmed OTPL's open the second analog switch S2 (21) after go through the inverter, thus disconnects the one wire to multi-wire module (14) from the terminal OUT (16).

It should be noted that the embodiments of the present invention are described in the above through specific examples, and those with ordinary skill in the art can easily understand other advantages and effects of the present invention according to the content disclosed in the specification. The present invention may also be implemented or applied through other different specific examples, and various modifications and variations may be made to the details in the specification on the basis of different opinions and applications without departing from the principle of the present invention.

What is claimed is:

1. A one wire programmable circuit, comprising:
    a main circuit module;
    an OTP module for controlling the main circuit module;
    an OTP controlling module for controlling a read/write/programming of the OTP module;
    one wire to multi-wire converter communicating with the OTP controlling module;
    a first analog switch S1, a second analog switch S2 and a third analog switch S3 controlled by an output state of a bit OTPL in the OTP module;
    a resistor R1 in parallel connection with the first analog switch S1 and a system clock controlled by the third analog switch S3;
    a terminal of the parallel connection between the resistor R1 and the first analog switch S1 is connected to an output terminal of the main circuit module;
    an other terminal of the parallel connection is connected to a terminal OUT for communicating with an external interface circuit; and
    a data terminal of the one wire to multi-wire converter is connected to the terminal OUT through the second analog switch S2 or connected to the OUT terminal directly;
    wherein the OTP controlling module is connected to the OTP module, and controls a setting of various parameters in the circuit through the OTP module; the first analog switch S1 is switched from an open position to a closed position after receiving a controlling signal from a programmed bit of OTPL.

2. The one wire programmable circuit of claim 1, wherein the bit OTPL is independent from other bits in the OTP module; a status of the OTPL is not affected by the read/write of the data from/to the OTP module; the output state of the OTPL is changed only after the OTPL is programmed; and when programming the OTP, the bit OTPL is the last bit that is programmed.

3. The one wire programming circuit of claim 2, the output terminal of the main circuit module is connected to the terminal OUT through the first analog switch S1 in a closed position by short circuiting the resistor R1.

4. The one wire programmable circuit of claim 2, wherein the OTP controlling module controls various parameters before the bit of OTPL is programmed; after the bit of OTPL has been programmed, the various parameters of the circuit are controlled by an output state of the OTP module.

5. The one wire programmable circuit of claim 2, wherein after the bit of OTPL has been programmed, the second analog switch S2 is switched from a normal closed position to an open position after receiving a controlling signal from the programmed bit of OTPL; the terminal OUT is connected to the main circuit module only and disconnected from the OTP controlling module.

* * * * *